(12) United States Patent
Suzuki et al.

(10) Patent No.: US 6,858,830 B2
(45) Date of Patent: Feb. 22, 2005

(54) OPTICAL RECEIVER APPARATUS AND HOLDING APPARATUS AND ARRANGING METHOD THEREOF

(75) Inventors: Takayuki Suzuki, Hamamatsu (JP); Yoshitaka Terada, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 153 days.

(21) Appl. No.: 09/977,287

(22) Filed: Oct. 16, 2001

(65) Prior Publication Data

US 2002/0020803 A1 Feb. 21, 2002

Related U.S. Application Data

(63) Continuation-in-part of application No. PCT/JP00/05714, filed on Aug. 24, 2000.

(30) Foreign Application Priority Data

Aug. 25, 1999 (JP) .......................................... P11-238460

(51) Int. Cl.[7] .............................................. H01J 40/14
(52) U.S. Cl. ........................... 250/214 AG; 250/214 A; 250/208.6; 250/227.11; 398/202
(58) Field of Search ..................... 250/227.11, 208.2, 250/214 A, 214 AG, 214 R, 208.6, 201.1, 206; 398/202–214, 119, 120; 375/345, 316; 455/232.1; 330/308

(56) References Cited

U.S. PATENT DOCUMENTS 5,164,581 A * 11/1992 Shiga ....................... 250/208.6

6,061,160 A * 5/2000 Maruyama ................... 398/201
6,333,804 B1 * 12/2001 Nishiyama et al. ......... 398/202
6,356,375 B1 * 3/2002 Holcombe .................. 398/209
6,384,948 B1 * 5/2002 Williams et al. ............ 398/202
6,493,490 B1 * 12/2002 Steiger ........................ 385/52

FOREIGN PATENT DOCUMENTS

| JP | 60-242740 | 12/1985 |
| JP | 62-202566 | 9/1987 |
| JP | 63-77171 | 4/1988 |

* cited by examiner

Primary Examiner—Thanh X. Luu
Assistant Examiner—Stephen Yam
(74) Attorney, Agent, or Firm—Morgan, Lewis & Bockius LLP

(57) ABSTRACT

An optical receiver (10) is constructed such that a signal receiving photodiode (12), an photometry detecting photodiode (14), a signal amplifying section (16) for amplifying the received signal, and a bias current control section (18) for controlling the bias current supplied to the signal amplifying section (16) are formed on a single substrate (20). The photodiode (12) is arranged on the optical axis of signal light to be detected and has a substantially circular photosensitive region smaller than the divergence of the signal light, whereas the photodiode (14) has a photosensitive region surrounding the photosensitive region of the photodiode (12). The bias current control section (18) actuates the signal amplifying section (16) when the signal current outputted from the photodiode (14) is at a predetermined reference value or higher.

12 Claims, 8 Drawing Sheets

OPTICAL RECEIVER APPARATUS AND HOLDING APPARATUS AND ARRANGING METHOD THEREOF

RELATED APPLICATION

This is a continuation-in-part application of application Ser. No. PCT/JP00/05714 filed on Aug. 24, 2000, now pending.

BACKGROUND OF THE INVENTION

1. Field of the Invention

The present invention relates to an optical receiver and its holding apparatus and arranging method.

2. Related Background Art

Optical receiver apparatus have ben widely utilized as an elemental technology and play an important part in optical communications together with optical transmitters. It is necessary for such an optical receiver to receive and process a large capacity of data at a high speed, thereby inevitably increasing its dissipation. Therefore, demands for lower dissipation have recently been increasing from the viewpoints of protecting environments, reducing the running cost, and so forth.

As an optical receiver satisfying the demands for lower dissipation, Japanese Patent Application Laid-Open No. SHO 60-242740, for example, discloses an optical receiver in which signal light is split by an optical divider, thus split two signal light components are fed into respective photodiodes for receiving a signal and monitoring, and the power of the receiving circuit is turned on only when the intesity of light incident on the monitoring photodiode falls within a predetermined range.

Since the input signal light is split by the optical divider, however, the optical receiver in accordance with the conventional technique mentioned above is problematic in that the intesity of input signal light incident on the signal receiving photodiode decreases so that the receiving capability deteriorates.

SUMMARY OF THE INVENTION

Therefore, it is an object of the present invention to overcome the above-mentioned problem, and provide an optical receiver exhibiting a high receiving capability and a low dissipation, and its holding apparatus and arranging method.

In order to achieve the above-mentioned object, the present invention provides an optical receiver for receiving an optical signal, the optical receiver comprising first photodetecting means, having a first photosensitive region, for outputting a first electric signal corresponding to the signal light incident on the first photosensitive region; second photodetecting means, having a second photosensitive region disposed externally close to a periphery of the first photosensitive region, for outputting a second electric signal corresponding to the signal light detected by the second photosensitive region; signal amplifying means for amplifying, according to a predetermined operating current or operating voltage, the first electric signal outputted from the first photodetecting means; and current control means for controlling, according to the second electric signal outputted from the second photodetecting means, the operating current or operating voltage supplied to the signal amplifying means.

The signal light incident on the optical receiver usually has a certain extent of divergence, so that its intensity is higher in the vicinity of the optical axis but lower in the periphery. Here, of the signal light having a divergence, a part having a high intensity in the vicinity of the optical axis is detected by the first photodetecting means, whereby the signal light sufficient for receiving the optical signal can be made incident on the optical receiver of the present invention. On the other hand, the operating current or operating voltage supplied to the signal amplifying means is controlled according to the second electric signal corresponding to the signal incident on the second photodetecting means, whereby the magnitude of the operating current or operating voltage can be controlled so as to attain an quantity corresponding to the necessity. Though the second photodetecting means detects, of the signal light having a divergence, a part having a low intensity in the periphery, the signal light incident on the second photodetecting means is not aimed at transmitting the optical signal but controlling the operating current or operating voltage supplied to the signal amplifying means, whereby it can fully achieve the aimed object even when its intensity is low.

In the optical receiver of the present invention, the current control means may control the operating current or operating voltage such that the operating current or operating voltage is supplied to the signal amplifying means when the second electric signal is at a predetermined reference value or higher.

If the operating current or operating voltage is supplied to the signal amplifying means when the second electric signal is at a predetermined reference value or higher, then the operating current or operating voltage can be supplied only when the operating current or operating voltage is necessary for the signal amplifying means.

The optical receiver of the present invention may be configured such that the first photosensitive region of the first photodetecting means is substantially circular, and the second photosensitive region of the second photodetecting means has a form surrounding the periphery of the first photosensitive region.

The first photodetecting means can efficiently detect the signal light if the first photosensitive region is substantially circular, whereas the second photodetecting means can efficiently detect the signal light if the second photodetecting means has a form surrounding the periphery of the first photosensitive region even when the first and second photodetecting means are dislocated with respect to the optical axis.

The optical receiver of the present invention may be configured such that the first photosensitive region of the first photodetecting means is substantially circular, and the second photosensitive region of the second photodetecting means has a plurality of separated detecting portions arranged along the periphery of the first photosensitive region.

The first photodetecting means can efficiently detect the signal light if the first photosensitive region is substantially circular, whereas the second photodetecting means can efficiently detect the signal light if a plurality of detecting portions constituting the second photosensitive region are arranged along the periphery of the first photosensitive region even when the first and second photodetecting means are dislocated with respect to the optical axis.

In the optical receiver of the present invention, the first and second photodetecting means may be formed on a single substrate.

If the first and second photodetecting means are formed on a single substrate, then the dead space formed in the portion between the first and second photosensitive regions can be made smaller.

In the optical receiver of the present invention, the first and second photodetecting means, the signal amplifying means, and the current control means may be formed on a single substrate.

If the first and second photodetecting means, the signal amplifying means, and the current control means are formed on a single substrate, then the optical receiver can be configured smaller.

The present invention provides a holding apparatus for an optical receiver, the holding apparatus comprising first holding means for holding an output end for outputting signal light having a divergence greater than the first photosensitive region, and second holding means for holding the optical receiver according to claim 1 such that the first photosensitive region is positioned on the optical axis of the signal light. Also, the present invention provides a method of arranging an optical receiver, the method comprising a first arranging step of arranging an output end for outputting signal light having a divergence greater than the first photosensitive region, and a second arranging step of arranging the optical receiver according to claim 1 such that the first photosensitive region is positioned on the optical axis of the signal light.

If the optical receiver is arranged such that the first photosensitive region is positioned on the optical axis of the signal light having a divergence greater than the first photosensitive region, then the signal light aimed at controlling the operating current or operating voltage can easily be detected by the second photosensitive region.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

The optical receiver in accordance with an embodiment of the present invention, and its holding apparatus and arranging method will be explained with reference to the drawings.

Figure 1:
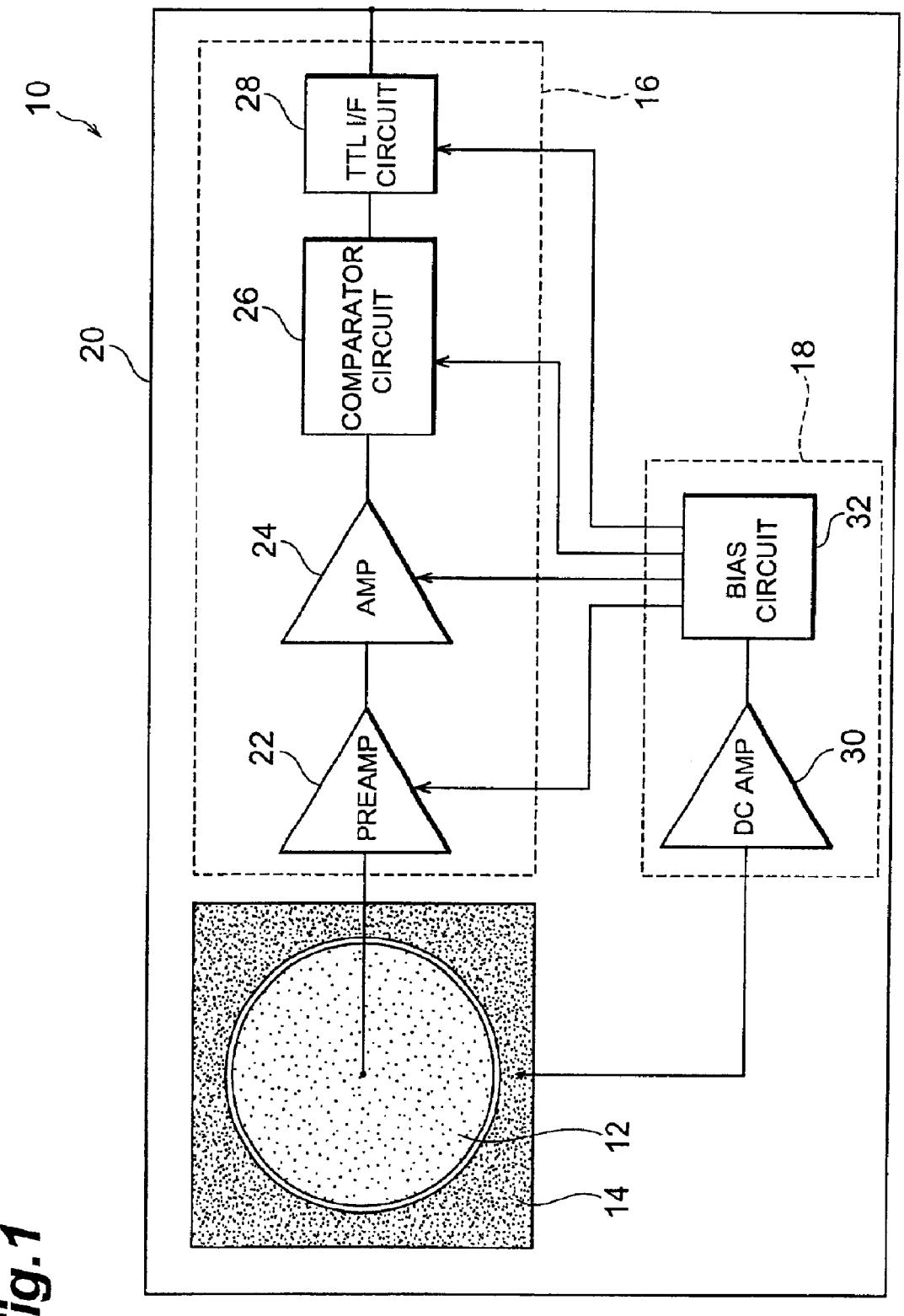
FIG. 1 is a block diagram of an optical receiver.

First, the configuration of the optical receiver in accordance with this embodiment will be explained. FIG. 1 is a block diagram of the optical receiver in accordance with the embodiment.

The optical receiver 10 in accordance with this embodiment is an optical receiver for receiving an optical signal. In particular, it is an optical receiver for receiving an optical signal emitted from an exit end of a plastic optical fiber. As shown in FIG. 1, the optical receiver 10 is constructed such that a signal receiving photodiode 12 (first photodetecting means), an photometry detecting photodiode 14 (second photodetecting means), a signal amplifying section 16 (signal amplifying means) for amplifying the received signal, and a bias current control section 18 (current control means) for controlling the bias current supplied to the signal amplifying section 16 are formed on a single substrate 20. In the following, the individual constituents will be explained in detail.

The photodiode 12 has a substantially circular photosensitive region (first photosensitive region), smaller than the divergence of the signal light, arranged on the optical axis of the signal light to be detected. More specifically, the photodiode 12 is arranged such that the center of the photosensitive region coincides with the optical axis of the signal light. Also, the photodiode 12 outputs the signal current (first electric signal) proportional to the intensity of the signal light incident on the photosensitive region.

The photodiode 14 has a photosensitive region (second photosensitive region) arranged externally close to the periphery of the photosensitive region of the photodiode 12. More specifically, the second photosensitive region has a form which is obtained when the circular form corresponding to the photosensitive region of the photodiode 12 is cut out from a square, and is arranged such that the center of the square coincides with the center of the photosensitive region. Also, the photodiode 14 outputs a signal current (second electric signal) proportional to the intensity of the signal light detected by the photosensitive region.

The signal amplifying section 16 comprises a preamplifier 22, an amplifier 24, a comparator circuit 26, and a TTL interface circuit 28 which are successively connected one to another; and amplifies, according to the bias current or bias voltage (operating current or operating voltage) controlled by the bias current control section 18, the signal current outputted from the photodiode 12. More specifically, the preamplifier 22 converts the signal current outputted from the photodiode 12 into a signal voltage, amplifies the signal voltage, and outputs thus amplified signal voltage. The amplifier 24 further amplifies the signal voltage outputted from preamplifier 22 and outputs thus amplified signal voltage. Here, the signal is amplified by two stages of the preamplifier 22 and amplifier 24 in order to secure a sufficient gain in a predetermined frequency band. The comparator circuit 26 compares the signal voltage outputted from the amplifier 24 with a predetermined reference voltage, outputs a signal voltage corresponding to a logical value of 1 if the signal voltage outputted from the amplifier 24 is at the predetermined reference voltage or higher, and outputs a signal voltage corresponding to a logical value of 0 if the signal voltage outputted from the amplifier 24 is lower than the predetermined reference voltage. Namely, the comparator circuit 26 converts the signal voltage outputted from the amplifier 24 into a digital signal and outputs thus obtained digital signal. The TTL interface circuit 28 acts as an interface in order for the digital signal outputted from the comparator circuit 26 to be outputted as a TTL logic to the outside.

The bias current control section 18 has a DC amplifier 30 and a bias circuit 32; and controls, according to the signal current outputted from the photodiode 14, the bias current or bias voltage (hereinafter referred to as bias current or the like). More specifically, the DC amplifier 30 converts the signal current outputted from the photodiode 14 into a signal voltage, amplifies the resulting signal voltage, and actuates the bias circuit according to thus amplified signal voltage. Specifically, the DC amplifier 30 actuates the bias circuit 32 if the amplified signal voltage is at a predetermined reference value or higher, whereby the bias circuit 32 supplies the bias current or the like to each of the preamplifier 22, amplifier 24, comparator circuit 26, and TTL interface circuit 28 constituting the signal amplifying section 16. If the amplified signal voltage is lower than a predetermined reference value, by contrast, then the DC amplifier 30 stops actuating the bias circuit 32, whereby the bias circuit 32 stops supplying the bias current or the like to each of the preamplifier 22, amplifier 24, comparator circuit 26, and TTL interface circuit 28 constituting the signal amplifying section 16. Here, the reference value for supplying the bias current or the like as the amplified signal voltage increases is greater than the reference value for stopping the supply of the bias current or the like as the amplified signal voltage decreases, thereby yielding a so-called hysteresis.

Figure 2:
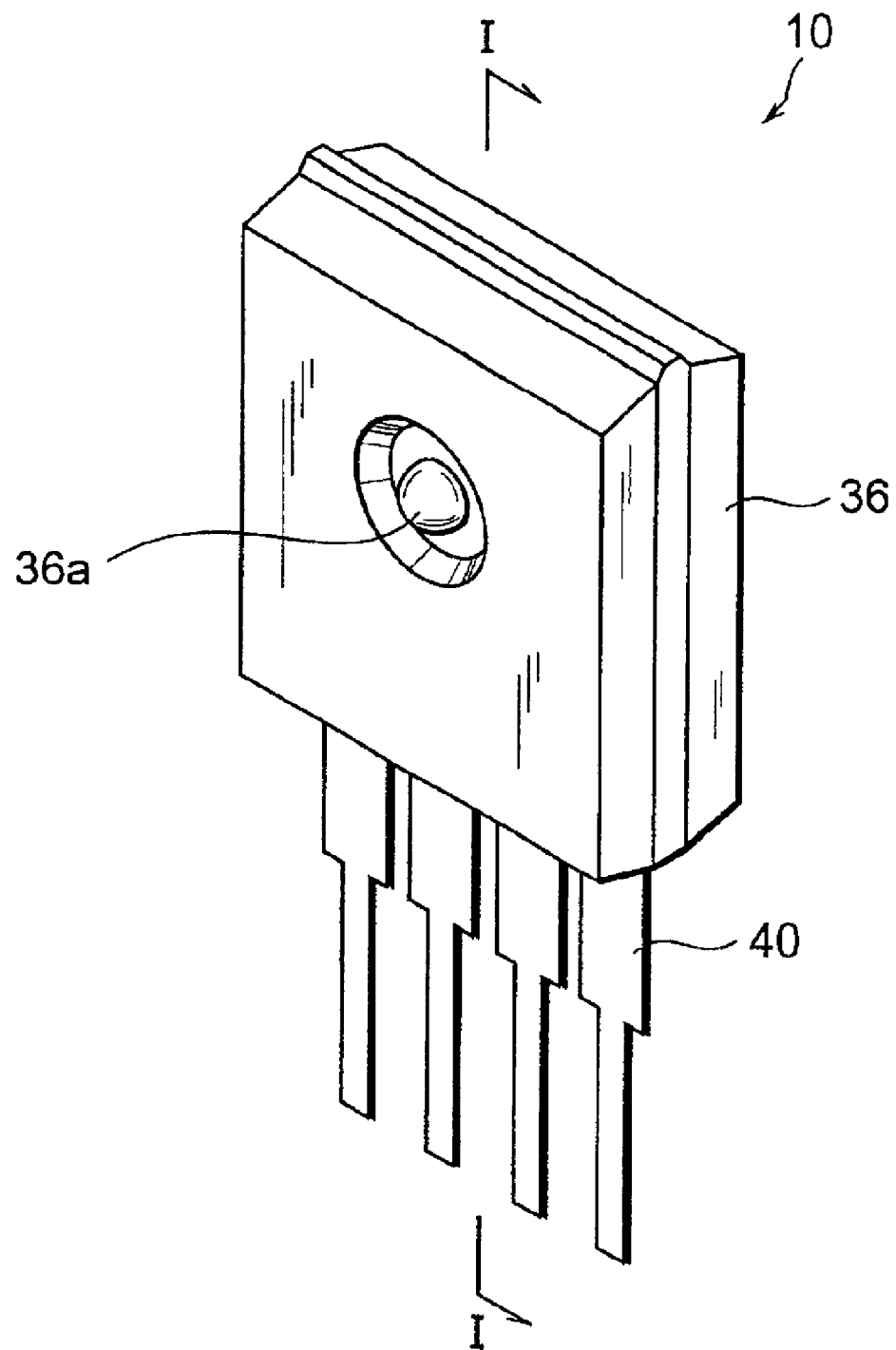
FIG. 2 is a perspective view of the optical receiver.
Figure 3:
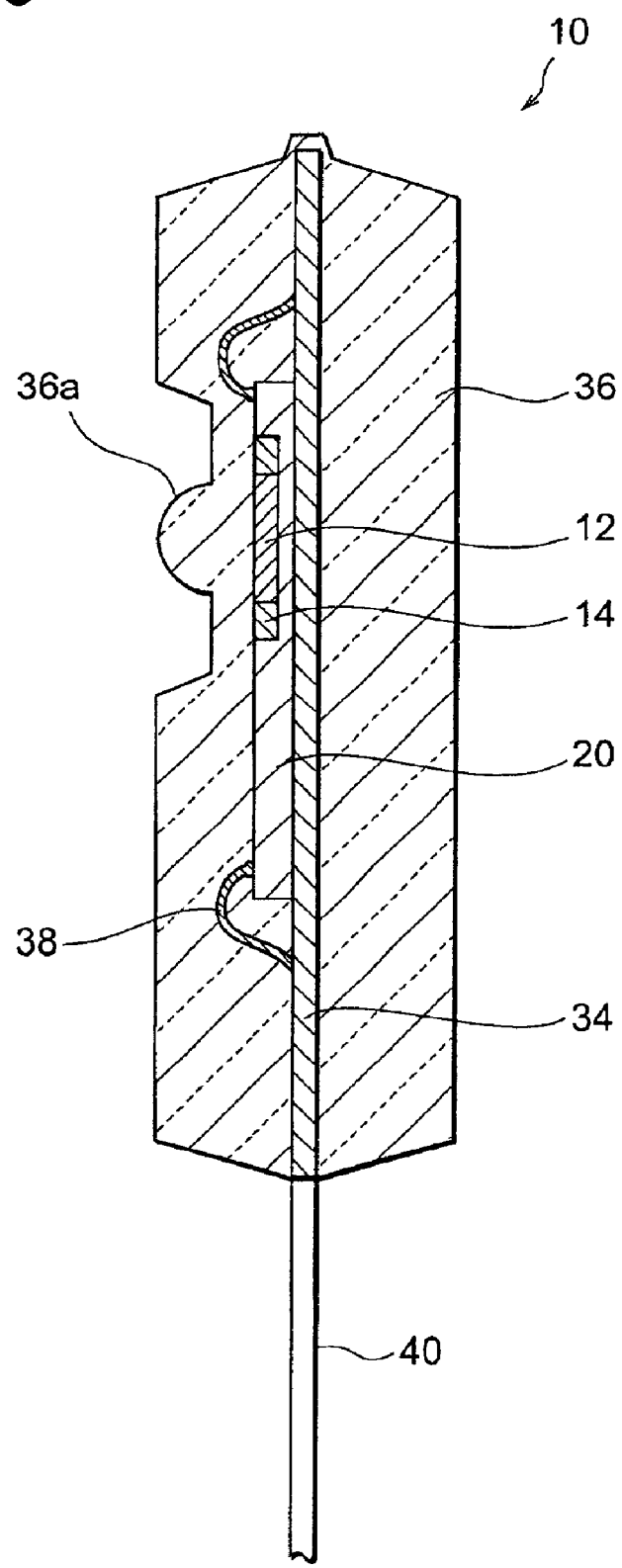
FIG. 3 is a sectional view taken along the line I—I in FIG. 2.

FIG. 2 is a perspective view of the optical receiver 10, whereas FIG. 3 is a sectional view taken along the line I—I of FIG. 2. As shown in FIGS. 2 and 3, the optical receiver 10 is constructed by resin-encapsulating the substrate 20 formed with the photodiodes 12, 14, signal amplifying section 16, and current control section 18. More specifically, the substrate 20 is resin-encapsulated with a transparent resin while in a state fixed onto a lead frame 34, whereas a mold part 36 for resin-encapsulating the substrate 20 has substantially a rectangular parallelepiped form. The substrate 20 and the lead frame 34 are electrically connected to each other by a wire 38, whereas a pin 40 electrically connected to the lead frame 34 projects outward from the mold part 36. As a consequence, the optical signal received by the optical receiver 10 is read out by way of the pin 40. In order for the signal light to be made efficiently incident on the photodiode 12, a semispherical lens part 36a is formed on the surface of the mold part 36 at a position opposing the photodiode 12.

Figure 4:
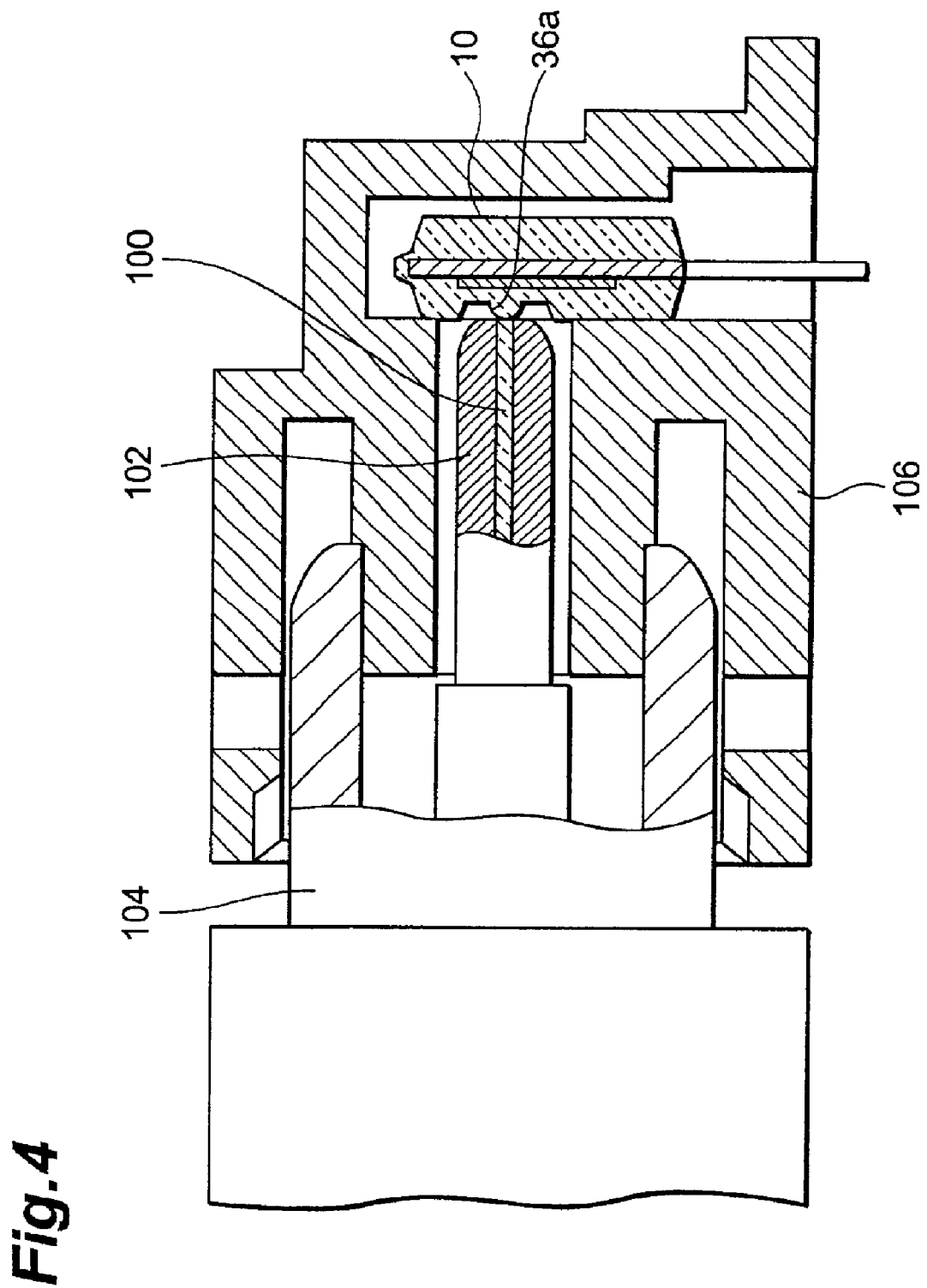
FIG. 4 is a view for explaining a mode of use of the optical receiver.

The mode of use of the optical receiver 10 (a holding apparatus and arranging method of the optical receiver in accordance with this embodiment) will now be explained. The optical receiver 10 is used in the mode shown in FIG. 4, for example. Namely, the optical receiver 10 is used while being arranged such that its lens part 36a faces the exit end of a plastic optical fiber 100 which propagates the signal light. Here, a tip portion of the plastic optical fiber 100 is provided with a ferrule 102 for protecting the tip portion, and further with a fiber connector 104. The positioning of the optical receiver 10 with respect to the exit end of the plastic optical fiber 100 is effected by inserting the fiber connector 104 and the optical receiver 10 into a fiber connector groove and an optical receiver groove which are formed in a receptacle 106.

Figure 5:
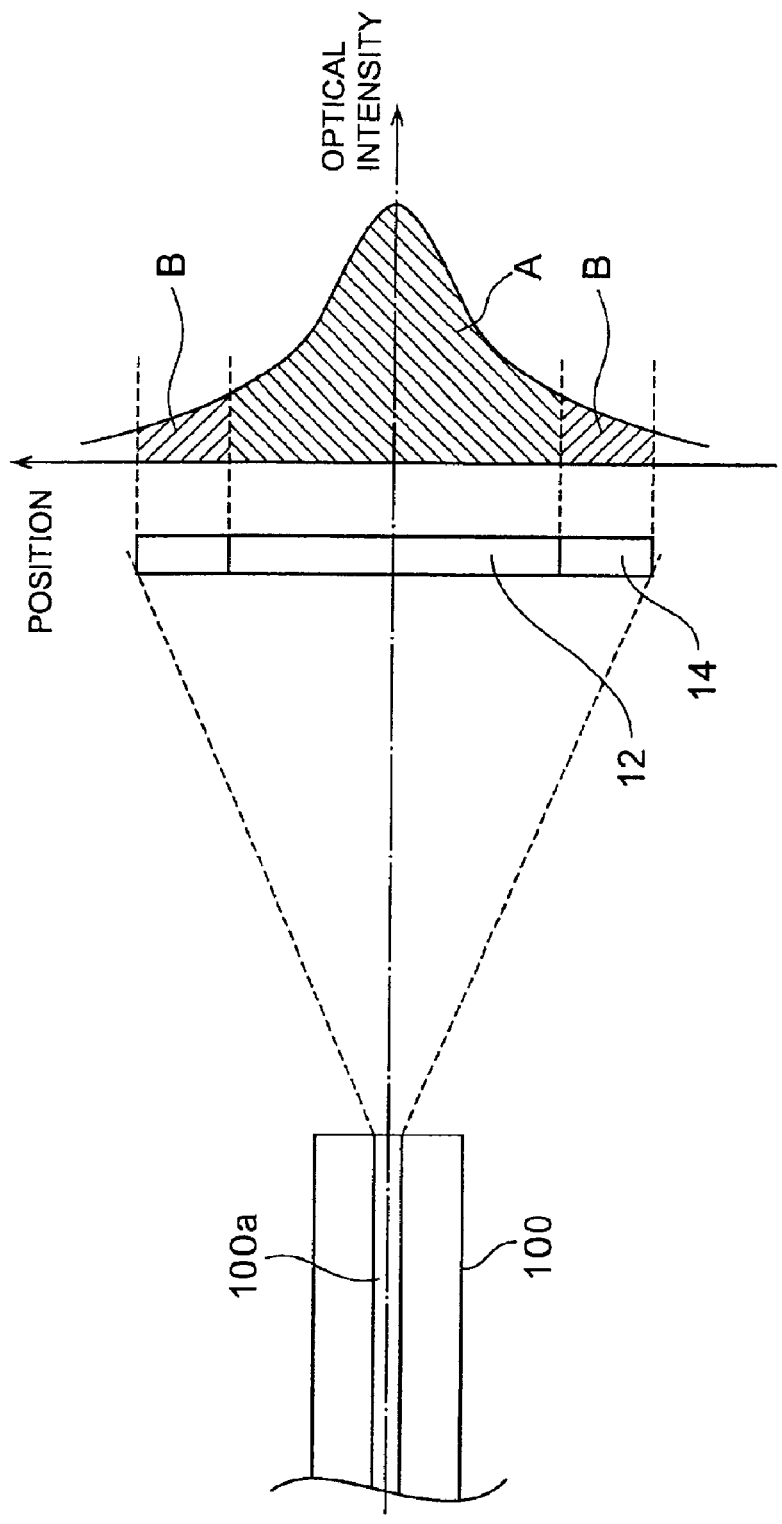
FIG. 5 is a view for explaining how signal light is emitted.

Operations of the optical receiver in accordance with this embodiment will now be explained. As shown in FIG. 5, the signal light emitted from the exit end of the plastic optical fiber 100 advances with a certain extent of divergence, whereby both of the photodiodes 12, 14 can detect this signal light. In this case, the signal light intensity exhibits a Gaussian distribution centered at the optical axis as shown in FIG. 5. Therefore, the photodiode 12 disposed on the optical axis of the signal light detects a signal light component sufficient for receiving the optical signal, whereas the photodiode 14 disposed outside detects a signal light component sufficient for controlling the bias current or the like supplied to the signal amplifying section 16. Operations of the optical receiver 10 when the photodiodes 12, 14 detect the respective signal light components will now be explained.

Figure 6:
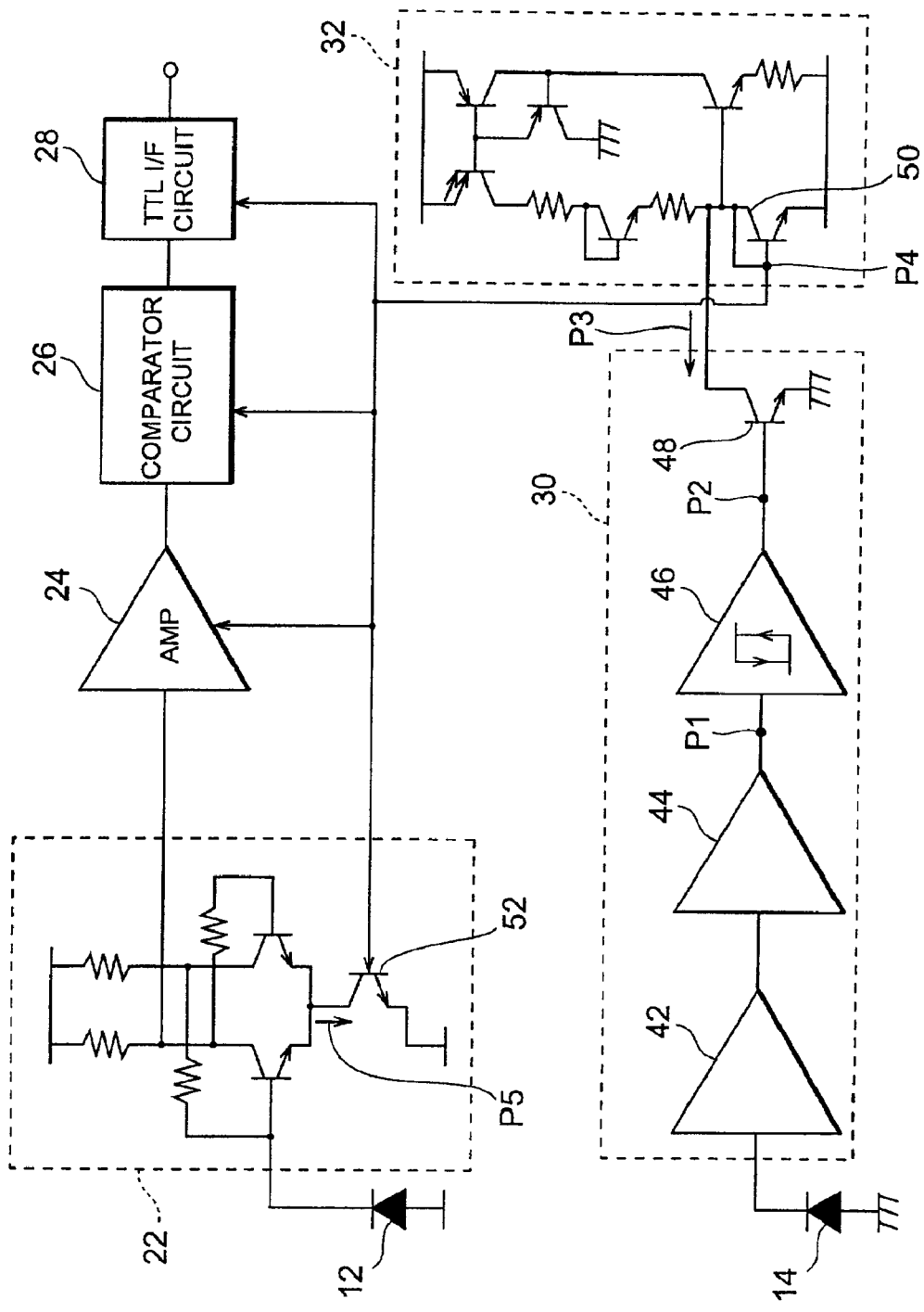
FIG. 6 is a circuit diagram of the optical receiver.
Figure 7:
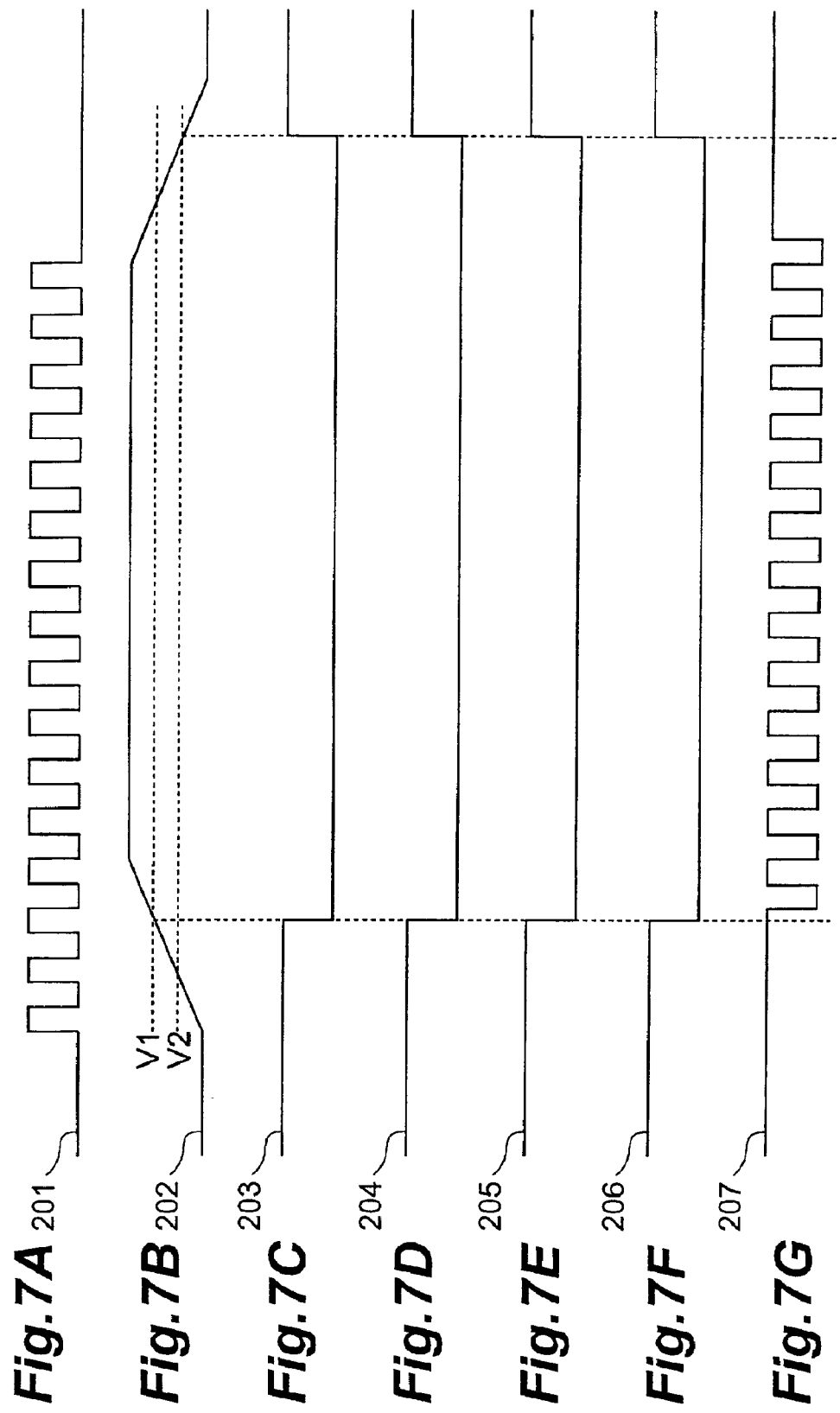
FIG. 7 is a timing chart showing operations of the optical receiver.

FIG. 6 is a circuit diagram of the optical receiver 10, whereas FIG. 7 is a timing chart for showing operations of the optical receiver 10. When pulsed signal light represented by a chart 201 in FIG. 7 is incident on the photodiodes 12, 14, the photodiode 14 outputs a current proportional to the signal light intensity, and this current is fed into the DC amplifier 30.

More specifically, the DC amplifier 30 is constructed such that a current amplifying circuit 42, a current/voltage converting circuit 44, a hysteresis comparator 46, and a switching transistor 48 are connected in series. The current outputted from the photodiode 14 is fed into and amplified by the current amplifying circuit 42, and then is fed into the current/voltage converting circuit 44, where it is integrated so as to be converted into a voltage and is amplified. As a result, the voltage on the output side (P1 in FIG. 6) of the current/voltage converting circuit 44 is represented by a chart 202 in FIG. 7.

The voltage amplified by the current/voltage converting circuit 44 is fed into the hysteresis comparator 46, where it is compared with a reference voltage V1. At the time when the amplified voltage has gradually increased to the reference voltage V1 or higher, the hysteresis comparator 46 outputs a low voltage corresponding to a logical value of 0. At the time when the amplified voltage has gradually decreased to a reference voltage V2 or lower, the hysteresis comparator 46 outputs a high voltage corresponding to a logical value of 1. The reference voltage V2 in this case is lower than the reference voltage V1. This aims at preventing the output signal from the hysteresis comparator 46 from vibrating between the logical values of 0 and 1 when the signal light intensity minutely fluctuates in the vicinity of the reference voltage V1. The output end of the hysteresis comparator 46 is connected to the base of the switching transistor 48, whereby the ON/OFF of the switching transistor 48 is controlled by the voltage outputted from the hysteresis comparator 46. The voltage on the output side (P2 in FIG. 6) of the hysteresis comparator 46 is represented by a chart 203 in FIG. 7.

The bias circuit 32 is specifically a band-portion reference voltage source circuit, which operates according to the ON/OFF of the switching transistor 48. Namely, when the switching transistor 48 is ON, the current flowing between the collector and emitter of a transistor 50 for determining the reference voltage is bypassed to a line (P3 in FIG. 6) connected to the collector of the switching transistor 48, whereby the output voltage from the base (P4 in FIG. 6) of the transistor 50 becomes substantially 0 V. When the switching transistor 48 is OFF, by contrast, no current flows through the line connected to the collector of the switching transistor 48, whereas a current flows between the collector and emitter of the transistor 50 for determining the reference voltage, whereby the output voltage from the base of the transistor 50 becomes the reference voltage determined by the transistor 50. The current flowing through the line (P3 in FIG. 6) connected to the collector of the switching transistor 48 and the voltage at the base (P4 in FIG. 6) are represented by charts 204 and 20S in FIG. 7, respectively.

The base of the transistor 50 in the bias circuit 32 is connected to respective devices for actuating the preamplifier 22, amplifier 24, comparator circuit 26, and TTL interface circuit 28 constituting the signal amplifying section 16. Here, the preamplifier 22 will be explained in detail by way of example. The preamplifier 22 is specifically a differential amplifier, whereas the output voltage from the bias circuit 32 is fed into the base of a transistor 52 constituting a constant current source for determining the bias current of the differential amplifier. Namely, if the reference voltage is fed into the base of the transistor 52 in the preamplifier 22 from the bias circuit 32, then a bias current flows between the collector and emitter (P5 in FIG. 6) of the transistor 52 as represented by a chart 206 in FIG. 7, whereby the preamplifier 22 is actuated. If the reference voltage is not fed into the base of the transistor 52 in the preamplifier 22 from the bias circuit 32 (i.e., 0 V is fed therein), by contrast, then no bias current flows into the preamplifier 22, whereby the preamplifier 22 is not actuated. Similarly, the amplifier 24, comparator circuit 26, and TTL interface circuit 28 are actuated as the bias current or the like is supplied thereto only when the reference voltage is fed therein from the bias circuit 32. As a result, the output signal from the TTL interface circuit 28 is represented by a chart 207 in FIG. 7.

Workings and effects of the optical receiver in accordance with this embodiment will now be explained. As explained with reference to FIG. 5, the signal light incident on the optical receiver usually has a certain extent of divergence such that its intensity is higher in the vicinity of the optical axis and lower in the periphery. Here, in the optical receiver 10 in accordance with this embodiment, a part having a higher intensity in the vicinity of the optical axis in the signal light having a divergence is detected by the photodiode 12. Therefore, as compared with a case where an optical divider is used and the like, a signal light component sufficient for receiving an optical signal can be detected by the photodiode 12, whereby the receiving capability becomes very high.

Also, in the signal light having a divergence, a part having a lower intensity in the periphery is detected by the photodiode 14, and the bias current supplied to the signal amplifying section 16 is controlled according to the signal voltage corresponding to the signal light incident on the photodiode 14. In particular, control is effected such that the bias current or the like is supplied to each of the preamplifier 22, amplifier 24, comparator circuit 26, and TTL interface circuit 28 constituting the signal amplifying section 16 only when the signal voltage becomes a predetermined reference voltage or higher. Consequently, the bias current or the like can be supplied to the preamplifier 22, amplifier 24, comparator circuit 26, and TTL interface circuit 28 only when it is necessary for them to be actuated upon incidence of signal light, whereby the dissipation becomes much lower than that in the case where these circuits are always kept waiting in an operating state. Also, since the dissipation becomes very low, the quantity of heat generation is reduced.

Here, while the photodiode 14 detects a low intensity portion in the periphery of signal light having a divergence, the signal light incident on the photodiode 14 is not aimed at transmitting the optical signal but controlling the bias current or the like for actuating the preamplifier 22, amplifier 24, comparator circuit 26, and TTL interface circuit 28, whereby it can sufficiently fulfill its aimed object even if its intensity is low.

Since the photosensitive region of the photodiode 12 is made substantially circular, the optical receiver 10 in accordance with this embodiment can efficiently detect the signal light by using the photodiode 12. Also, since the photosensitive region of the photodiode 14 is formed so as to surround the periphery of the photosensitive region of the photodiode 12, the signal light can efficiently be detected by the photodiode 14 even if the photodiodes 12, 14 are dislocated with respect to the optical axis.

Since the photodiodes 12, 14, the signal amplifying section 16, and the bias current control section 18 are formed on the same substrate 20 in the optical receiver 10 in accordance with this embodiment, the dead space formed in the portion between the photodiodes 12 and 14 can be reduced, and the optical receiver 10 can be made smaller.

Figure 8:
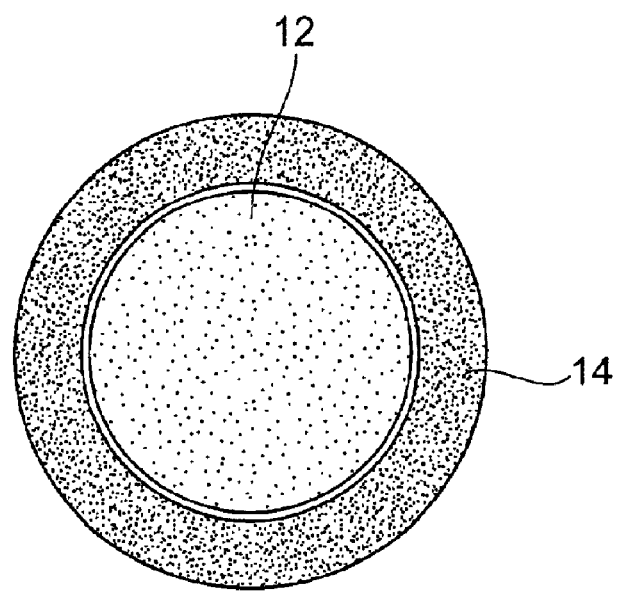
FIG. 8 is a view showing forms of photodiodes.
Figure 9:
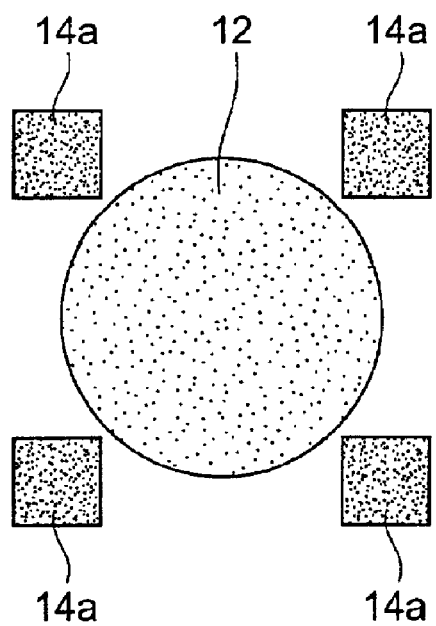
FIG. 9 is a view showing forms of photodiodes.

Though the photosensitive region of the photodiode 14 in the optical receiver 10 in accordance with the above-mentioned embodiment has a form obtained when a circle is cut out from a square, it may have a doughnut-like form concentric with the photosensitive region of the photodiode 12 as shown in FIG. 8. Further, as shown in FIG. 9, the photosensitive region of the photodiode 14 may comprise a plurality of (e.g., four) separated detecting portions 14a arranged along the periphery of the photosensitive region of the photodiode 12. Preferably, in this case, the plurality of detecting portions 14a are arranged along the periphery of the photosensitive region of the photodiode 12 at equally spaced intervals, while being separated from the center of the photosensitive region of the photodiode 12 by the same distance.

Of the signal light having a divergence, a part having a high intensity in the vicinity of the optical axis is detected by the first photodetecting means, whereby the signal light sufficient for receiving the optical signal can be made incident on the optical receiver of the present invention. As a result, the receiving capability can be enhanced as compared with a case where an optical divider is used and the like. Also, since the operating current or operating voltage supplied to the signal amplifying means is controlled according to the second electric signal corresponding to the signal light incident on the second photodetecting means, the magnitude of the operating current or operating voltage can be controlled so as to attain an quantity corresponding to the necessity, whereby the dissipation can be lowered.

If the operating current or operating voltage is supplied to the signal amplifying means when the second electric signal is at a predetermined reference value or higher in the optical receiver of the present invention, then the operating current or operating voltage can be supplied to the signal amplifying means only when the operating current or operating voltage is necessary for the signal amplifying means. As a result, the dissipation can be made very low.

If the first photosensitive region is made substantially circular in the optical receiver, then the first photodetecting means can efficiently detect the signal light. If the second photosensitive region has a form surrounding the periphery of the photosensitive region, or a plurality of detecting portions constituting the second photosensitive region are arranged along the periphery of the first photosensitive region, then the second photodetecting means can efficiently detect the signal light even when the first and second photodetecting means are dislocated with respect to the optical axis.

If the first and second photodetecting means are formed on a single substrate in the optical receiver of the present invention, then the dead space formed in the portion between the first and second photosensitive regions can be reduced. Further, if the signal amplifying means and current control means are formed on the same substrate as well, then the optical receiver can be constructed smaller.

In the holding apparatus and arranging method of an optical receiver in accordance with the present invention, since the optical receiver is arranged such that the first photosensitive region is positioned on the optical axis of signal light having a divergence greater than the first photosensitive region, the signal light aimed at controlling the operating current or operating voltage can easily be detected by the second photosensitive region.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical receiver comprising:
   a first photosensitive region;
   a second photosensitive region;
   a signal amplifying section connected to said first photosensitive region;
   current control means for controlling, according to an electric signal from said second photosensitive region, an operating current or operating voltage supplied to said signal amplifying section; and
   a lens,
   wherein,
   said second photosensitive region surrounds the first photosensitive region, said first and second photosensitive regions being arranged so that said second photosensitive region receives a part of light from a plastic optical fiber,
   said lens is a part of a mold part,
   said mold part is comprised of resin,
   said mold part encapsulates said first photosensitive region,
   said mold part encapsulates said second photosensitive region,
   said mold part encapsulates said signal amplifying section, and
   said mold part encapsulates said current control means.

2. An optical receiver according to claim 1, wherein said current control means controls said operating current or operating voltage such that said operating current or operating voltage is supplied to said signal amplifying section when the electric signal from said second photosensitive region is at a predetermined reference value or higher.

3. An optical receiver according to claim 1, wherein said first photosensitive region is substantially circular.

4. An optical receiver according to claim 3, wherein said second photosensitive region has a plurality of separated detecting portions arranged along a periphery of said first photosensitive region.

5. An optical receiver according to claim 1, wherein said first and second photosensitive regions are formed on a single substrate.

6. An optical receiver according to claim 5, wherein said signal amplifying section and said current control means are formed on said single substrate.

7. An optical receiver according to claim 1, further comprising a receptacle for accommodating said mold part and said plastic optical fiber.

8. An optical receiver according to claim 1, wherein said lens is a semispherical lens.

9. An optical receiver according to claim 1,
   wherein said amplifying section comprises an amplifier connected to said first photosensitive region and a comparator circuit connected to an output of said amplifier.

10. An optical receiver according to claim 1,
    wherein said current control means comprises a hysteresis comparator connected to said second photosensitive region and that outputs signal determining said operating current or operating voltage.

11. A holding apparatus for an optical receiver according to claim 1, said holding apparatus comprising:
    first holding means for holding an output end for outputting light having a divergence greater than said first photosensitive region; and
    second holding means for holding said optical receiver such that said first photosensitive region is positioned on an optical axis of light.

12. A method of arranging an optical receiver according to claim 1, said method comprising:
    a first arranging step of arranging an output end for outputting light having a divergence greater than said first photosensitive region; and
    a second arranging step of arranging said optical receiver such that said first photosensitive region is positioned on an optical axis of light.

* * * * *